US008212599B2

(12) United States Patent
Bhuiyan et al.

(10) Patent No.: US 8,212,599 B2
(45) Date of Patent: Jul. 3, 2012

(54) TEMPERATURE-STABLE OSCILLATOR CIRCUIT HAVING FREQUENCY-TO-CURRENT FEEDBACK

(75) Inventors: Ekram H. Bhuiyan, San Jose, CA (US); Shufan Chan, Anaheim Hills, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 12/650,208

(22) Filed: Dec. 30, 2009

(65) Prior Publication Data

US 2011/0156760 A1    Jun. 30, 2011

(51) Int. Cl.
*H03K 5/01* (2006.01)
(52) U.S. Cl. .......................... 327/165; 327/164; 327/178
(58) Field of Classification Search .................. 327/164, 327/165, 178
See application file for complete search history.

(56) References Cited

U.S. PATENT DOCUMENTS

| | | | | |
|---|---|---|---|---|
| 5,334,953 A * | 8/1994 | Mijuskovic | ...................... | 331/8 |
| 5,600,272 A * | 2/1997 | Rogers | .......................... | 327/157 |
| 5,606,731 A * | 2/1997 | Pace et al. | ...................... | 455/260 |
| 5,994,967 A * | 11/1999 | Nguyen | ........................ | 331/1 R |
| 6,011,446 A | 1/2000 | Woods | | |
| 6,353,368 B1 * | 3/2002 | Iravani | ............................. | 331/57 |
| 6,614,313 B2 * | 9/2003 | Crofts et al. | .................. | 331/1 R |
| 6,794,916 B1 * | 9/2004 | Varma | ........................... | 327/218 |
| 6,947,514 B1 * | 9/2005 | Kato et al. | ..................... | 375/376 |
| 7,372,338 B2 | 5/2008 | Tseng | | |
| 7,646,253 B2 * | 1/2010 | Kwan et al. | .................... | 331/1 R |
| 7,876,163 B2 * | 1/2011 | Hachigo | .......................... | 331/16 |
| 2008/0068091 A1 * | 3/2008 | Kwan et al. | ..................... | 331/16 |
| 2008/0157882 A1 * | 7/2008 | Krah | ............................... | 331/18 |

OTHER PUBLICATIONS

International Search Report issued in international application No. PCT/US2010/058660, mailed Mar. 14, 2011 (5 pages).
International Written Opinion issued in international application No. PCT/US2010/058660, mailed Mar. 14, 2011 (8 pages).
Zeynep Toprak and Yusuf Leblebici: A Novel 1V-Supply, Low Power, Wide Turning Range Voltage Controlled Oscillator Implemented in 0.18/μm CMOS Technology, Swiss Federal Institute of Technology, Lausanne, Switzerland, believed to be publicly available prior to Dec. 30, 2009, 4 pages.

\* cited by examiner

*Primary Examiner* — Lincoln Donovan
*Assistant Examiner* — Ryan Jager
(74) *Attorney, Agent, or Firm* — Brinks Hofer Gilson & Lione

(57) ABSTRACT

A signal generating circuit and method are disclosed that do not require a phase-locked-loop and a low frequency temperature-stable oscillator. The method may include generating an oscillating output signal responsive to a feedback signal, where the feedback signal controls a frequency of the oscillating output signal, generating a current output signal having a magnitude corresponding to the frequency of the oscillating output signal, and then comparing the current output signal to a reference signal to generate the feedback signal. The signal generating circuit may include an oscillator circuit responsive to a feedback signal and a frequency-to-current conversion circuit configured to generate a frequency dependent current signal that is compared to a reference current to generate an output signal corresponding to the frequency of the oscillating output signal. A feedback conversion circuit compares the output signal with a reference signal to generate the feedback signal to the oscillator circuit.

17 Claims, 6 Drawing Sheets

TEMPERATURE-STABLE OSCILLATOR CIRCUIT HAVING FREQUENCY-TO-CURRENT FEEDBACK

FIELD OF THE INVENTION

The present invention generally relates to oscillators and, more particularly, to a temperature-stable signal generator having frequency-to-current feedback.

BACKGROUND

An electronic oscillator is an electronic circuit that produces a repetitive output signal. The output signal may be a sinusoid, square wave, or other signal exhibiting a periodic signal characteristic.

Oscillating square waves are often used as clock signals in integrated circuit devices having digital components, or are used with external digital components. In some instances, the frequency of the clock signal is programmable over a predetermined range of frequencies. The stability of the frequency of the clock signal at a given programmed frequency may impact the overall performance of the integrated circuit.

Frequency stability of the clock signal is impacted, among other things, by temperature. One approach to providing temperature stability of the clock signal frequency is to minimize the temperature drift of every circuit component in the oscillator signal path. This approach, however, is sensitive to manufacturing process variations. Another approach involves using a complex phase-lock-loop circuit working in conjunction with an accurate, temperature stable low frequency reference oscillator. The stable, low-frequency oscillator may provide a circuit that is less sensitive to manufacturing process variation than the first noted approach. However, this approach is typically implemented using a large area of the semiconductor material and, further, often requires higher power dissipation.

SUMMARY

A signal generator is set forth that comprises an oscillator circuit, a frequency-to-current conversion circuit, and a feedback conversion circuit. The oscillator circuit is responsive to a feedback signal to control the frequency of an oscillating output signal. The frequency-to-current conversion circuit is configured to generate a frequency dependent current signal corresponding to the frequency of the oscillating output signal. The frequency dependent current signal is compared to a reference current to generate an output signal from the frequency-to-current conversion circuit having a signal magnitude corresponding to the frequency of the oscillating output signal. A feedback conversion circuit is configured to compare the output signal of the frequency-to-current conversion circuit with a reference signal to generate the feedback signal to the oscillator circuit.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The components in the figures are not necessarily to scale, emphasis instead being placed upon illustrating the principles of the invention.

DETAILED DESCRIPTION

Figure 1:
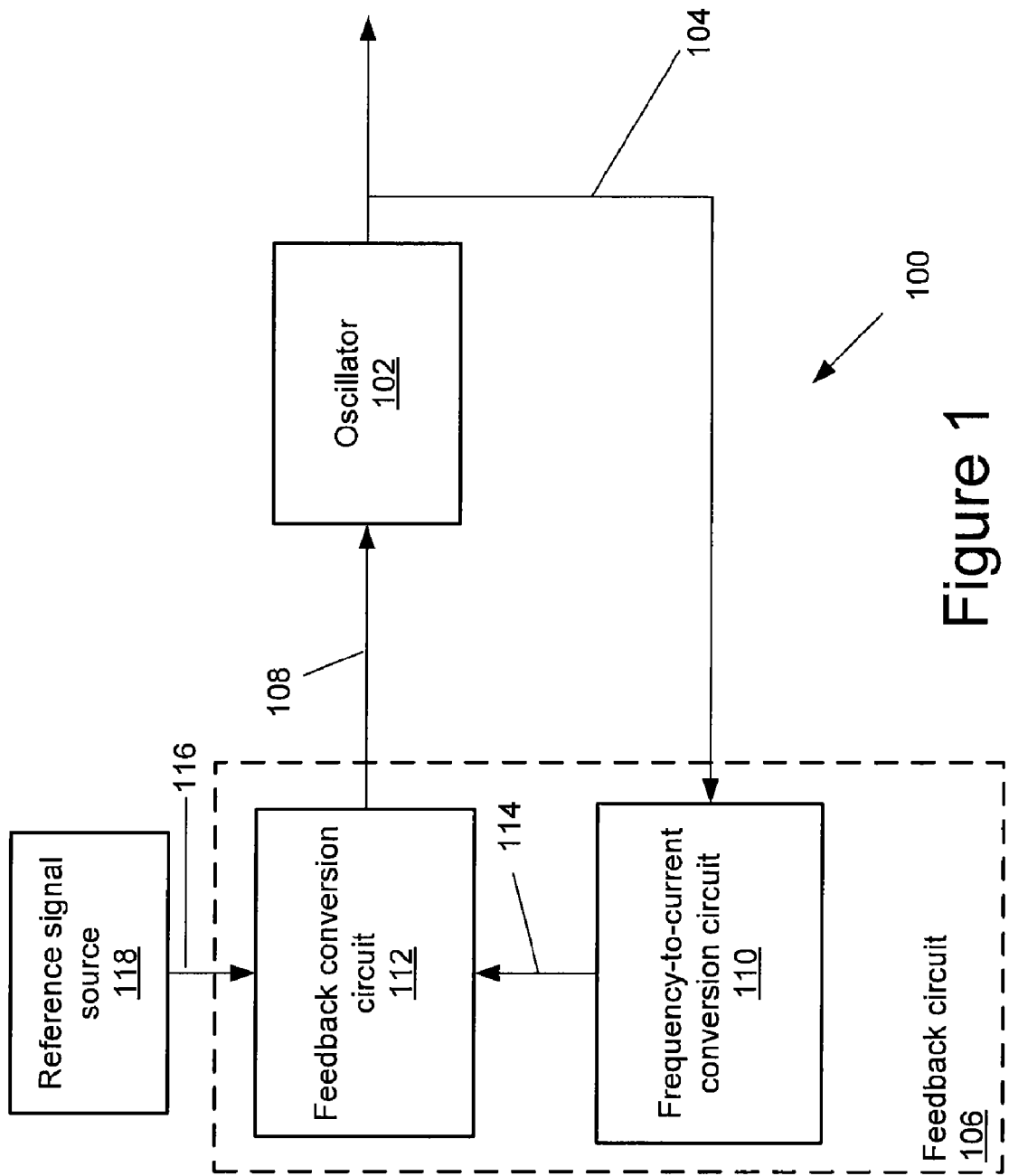
FIG. 1 is a functional block diagram of a signal generator having an oscillating output signal, where the signal generator includes a frequency-to-current conversion circuit in a feedback loop to an oscillator circuit.

FIG. 1 is a functional block diagram of a signal generator, shown generally at 100. The signal generator 100 includes an oscillator 102 that provides an oscillating output signal 104. The oscillating output signal 104 is provided to the input of a feedback circuit, shown generally at 106. The feedback circuit 106 provides a feedback signal 108 to the oscillator circuit 102. The oscillator circuit 102 is responsive to the feedback signal 108 to control the frequency of the output signal 104.

The feedback circuit 106 of signal generator 100 includes a frequency-to-current conversion circuit 110 and a feedback conversion circuit 112. The frequency-to-current conversion circuit 110 is in electrical communication with the oscillating output signal 104 and is configured to generate an output signal 114 having a signal magnitude corresponding to the frequency of the oscillating output signal 104. The output 114 is generated by comparing a reference current with a frequency dependent current. The feedback conversion circuit 112 is in electrical communication with the output signal 114 of the frequency-to-current conversion circuit 110. The feedback conversion circuit 112 is configured to compare the output signal 114 to a reference signal 116 provided from a reference signal source 118.

Figure 2:
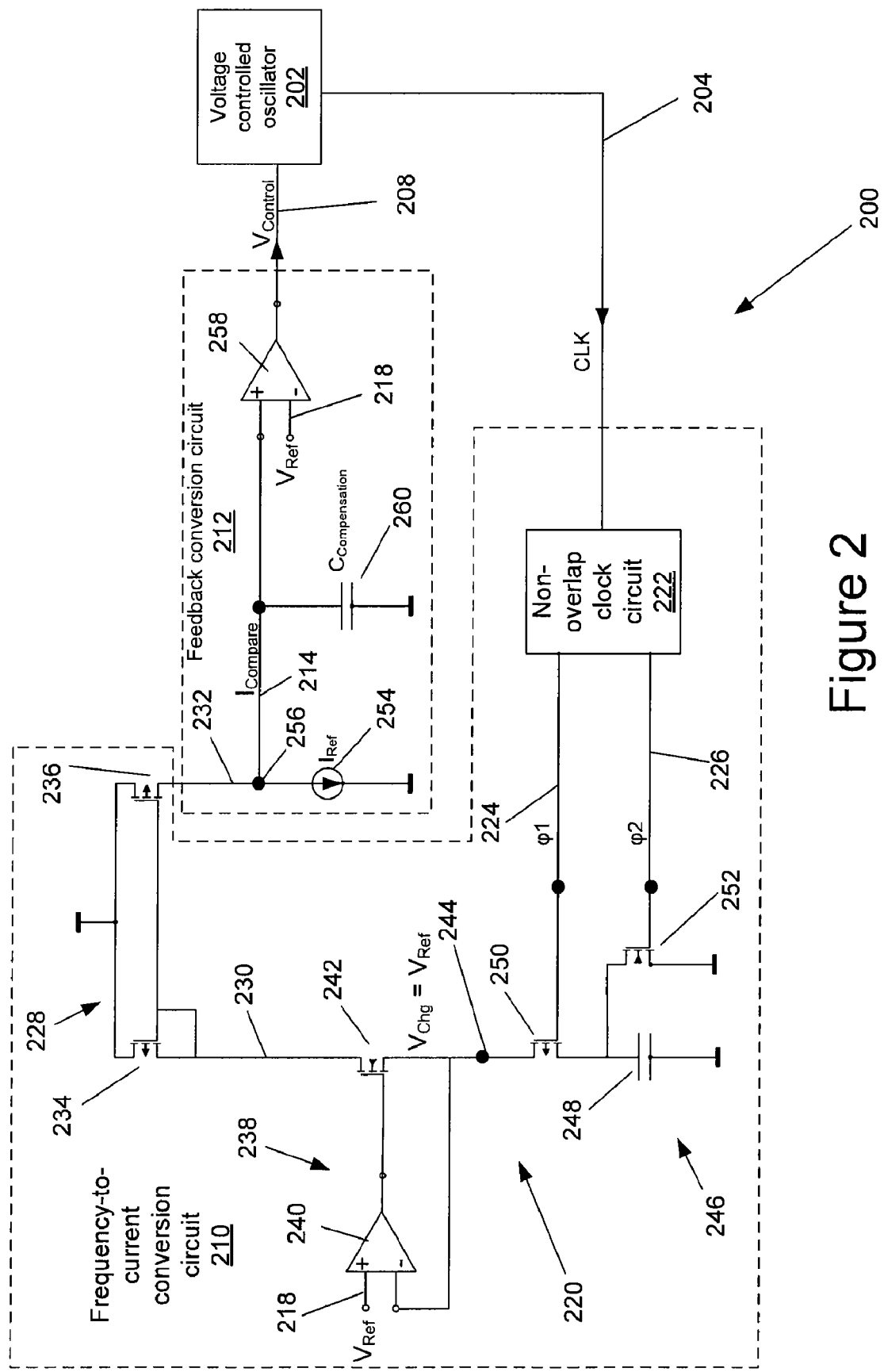
FIG. 2 is a circuit used to implement the signal generator of FIG. 1, where the oscillator is a voltage controlled oscillator.

FIG. 2 shows a signal generator 200 that is an embodiment of the signal generator 100 of FIG. 1, where the oscillator is a voltage controlled oscillator 202. Although the oscillating output signal 204 of the voltage controlled oscillator 202 may be any periodic waveform, the signal generator of FIG. 2 is described in the context of a clock output signal.

In the embodiment shown in FIG. 2, the frequency-to-current conversion circuit 210 includes a frequency-to-current converter 220 and a non-overlap clock circuit 222. The non-overlap clock circuit 222 is disposed to receive the oscillating output signal 204 from the voltage controlled oscillator 202. Using the oscillating output signal 204, the non-overlap clock circuit 222 generates non-overlapping clock signals 224 and 226. At least a portion of the non-overlapping clock signals 224 and 226 are out of phase with one another and correspond to the frequency of the oscillating output signal 204 of the voltage controlled oscillator 202. The frequency-to-current converter 220, in turn, is responsive to the non-overlapping clock signals 224 and 226 to generate the output signal 214 to the feedback conversion circuit 212.

The frequency-to-current converter 220 includes a current mirror 228 having first and second current branches 230 and 232. The first branch 230 of the current mirror includes a PMOS transistor 234. The second branch 232 includes a PMOS transistor 236. Transistors 234 and 236 are interconnected with one another so that the amount of current flowing through transistor 236 matches the amount of current flowing through transistor 234.

A constant voltage reference 238 provides a constant voltage at a voltage charging node. The constant voltage reference 238 includes a differential amplifier 240 having its positive input connected to a voltage $V_{Ref}$ 218, an output connected to the gate of an NMOS transistor 242, and its negative input connected to the source of transistor 242. The drain of transistor 242 is in electrical communication with current branch 230 of current mirror 228. The source of transistor 242 is in electrical communication with the voltage charging node 244. The output of the constant voltage reference 238 provides a charging voltage $V_{Chg}$ at the voltage charging node 244 that equals the voltage $V_{Ref}$ 218 at the positive input of differential amplifier 240.

The charging voltage $V_{Chg}$ at the voltage charging node 244 is in electrical communication with a charging circuit 246. The charging circuit is responsive to the non-overlap clock signals 224 and 226 to alternately charge and discharge a capacitor 248 through a first MOS transistor 250 and a second MOS transistor 252. Although, the example of FIG. 2 illustrates the first MOS transistor 250 as a PMOS transistor and the second MOS transistor 252 as an NMOS transistor, the first transistor may be either PMOS or NMOS. To this end, the source of the PMOS transistor 250 is in electrical communication with the voltage charging node 244. The gate of transistor 250 is in electrical communication with non-overlap clock signal 224 and the drain in electrical communication with the capacitor 248. The drain of the NMOS transistor 252 is in electrical communication with a node that is common to the drain of transistor 250 and capacitor 248. In other implementations, the PMOS transistor 250 may be an NMOS transistor. Other circuit topologies may also be used to charge and discharge one or more capacitors of the charging circuit 246 in response to one or more non-overlapping clock signals.

Transistors 250 and 252 are switchable between conductive and non-conducted states based on receipt of their respective non-overlapping clock signals from the non-overlap clock circuit 222. In the embodiment of FIG. 2, the PMOS transistor 250 is switchable between a conductive and non-conductive state based on receipt of non-overlapping clock signal 224 and is used to charge the capacitor 248. The NMOS transistor 252 is switchable between a conductive and non-conductive state based on receipt of non-overlapping clock signal 226 and is used to discharge the capacitor 248.

The current flow through branch 230 of the current mirror 228 is dependent on the current flow used to charge and discharge capacitor 248. The current flow through branch 230, in turn, generates a corresponding current flow through transistor 236. The drain of transistor 236 is in electrical communication with a constant current reference 254 at a current comparison node 256. The difference between the current flow through transistor 236 and the current flow through the constant current reference 254 generates a current comparison signal at node 256. The magnitude of the difference corresponds to the frequency of the oscillating output signal 204. The constant current reference 254 may be any of a number of known types of temperature compensated current references.

In the embodiment of FIG. 2, the current comparison signal at node 256 is a correction voltage generated by the difference between the currents at node 256. The correction voltage is carried by signal 214. More particularly, the correction voltage is provided to a differential amplifier 258 for comparison with the voltage $V_{Ref}$ 218. The difference in the magnitude between the correction voltage at signal 214 and the magnitude of reference voltage $V_{Ref}$ 218 is used to generate a voltage control signal $V_{Control}$ that is provided as feedback signal 208 to oscillator 202. Here, oscillator 202 is a voltage controlled oscillator.

The feedback loop comprising the frequency-to-conversion circuit 210 and the feedback conversion circuit 212 may not be entirely stable. Such instability may result in the generation of parasitic oscillation of the feedback signal 208. To inhibit such parasitic oscillation, the feedback conversion circuit 212 may include a loop compensation circuit 260 arranged at the output of the frequency-to-current conversion circuit 210. The parameters of the loop compensation circuit 260 are dependent on the overall feedback parameters associated with the frequency-to-conversion circuit 210 and the feedback conversion circuit 212 as well as any other components in the feedback loop.

The frequency of the oscillating output signal 204 may be programmable. To this end, the magnitude of the feedback signal 208 may be directed to different values to achieve the desired frequency. In the embodiment of FIG. 2, this may be accomplished by programming the magnitude of the current of the constant current source 254. Changes in the magnitude of the current of the constant current source 254 are at least partially responsible for changes in the output signal 214 provided to the feedback conversion circuit 212. In turn, the changes at the output signal 214 result in corresponding changes of the feedback signal 208 that is provided to the oscillator 202. Changes to the feedback signal 208 result in corresponding changes in the frequency of the oscillating output signal number 204. Various manners of programming the magnitude of the currents of the constant current source 254 may be used. For example, a processor (not shown) may write a value to a register, where the value corresponds to the desired frequency. The value stored in the register may be used by the constant current source 254 to set the magnitude of its current value. In one embodiment, the constant current source 254 may be a current DAC (digital-to-analog converter) arranged to use this register value to generate the desired current.

Figure 3:
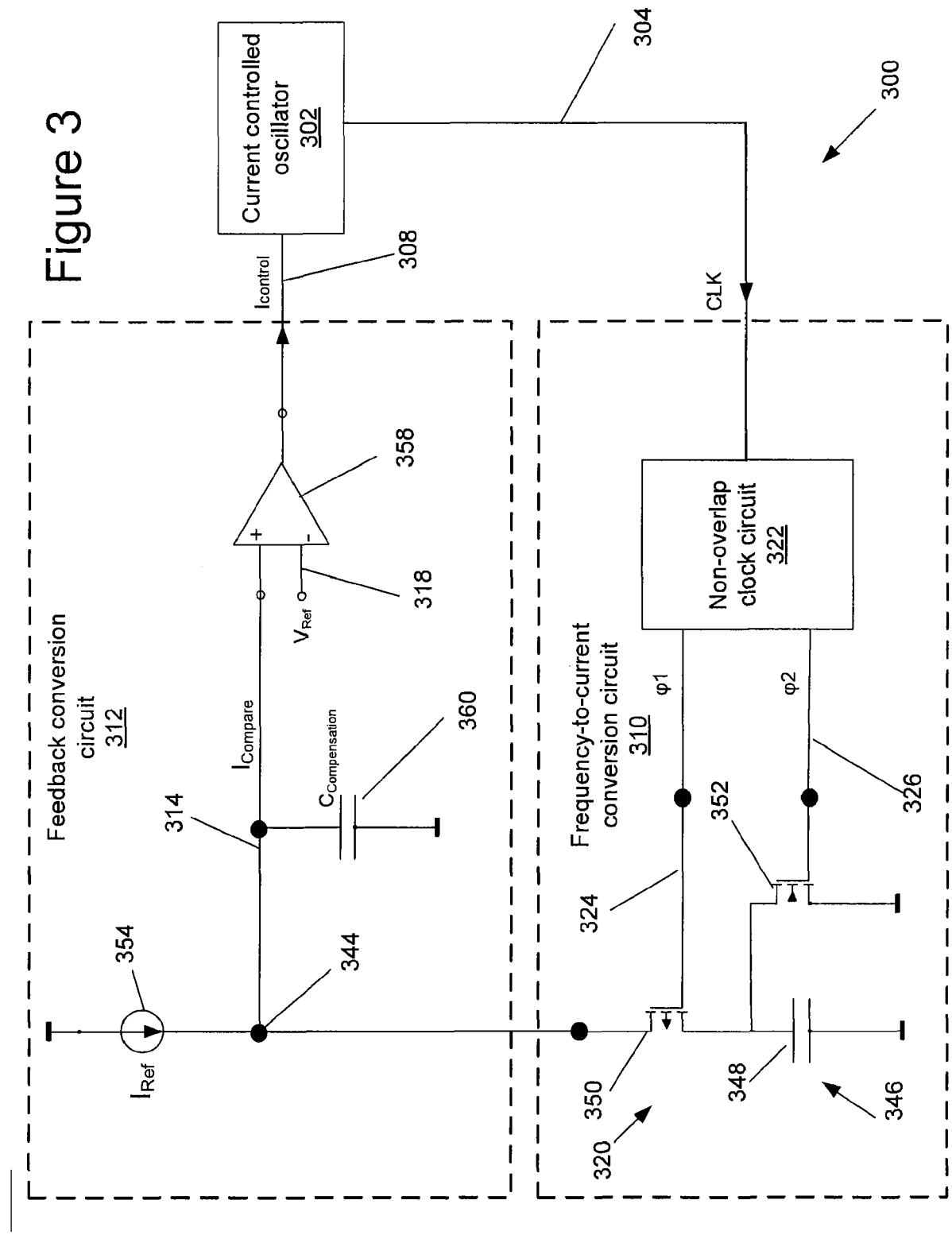
FIG. 3 is a circuit used to implement the signal generator of FIG. 1, where the oscillator is a current controlled oscillator.

FIG. 3 shows a signal generator 300 that is an alternative embodiment of the signal generator 100 of FIG. 1, where the oscillator is a current controlled oscillator 302. Although the oscillating output signal 304 of the current controlled oscillator 302 may be any periodic waveform, the signal generator of FIG. 3 is described in the context of a clock output signal.

In the embodiment shown in FIG. 3, the frequency-to-current conversion circuit 310 includes a frequency-to-current converter 320 and a non-overlap clock circuit 322. The non-overlap clock circuit 322 is disposed to receive the oscillating output signal 304 from the current controlled oscillator 302. Using the oscillating output signal 304, the non-overlap clock circuit 322 generates non-overlapping clock signals 324 and 326. At least a portion of the non-overlapping clock signals 324 and 326 are out of phase with one another and correspond to the frequency of the oscillating output signal 304 of the current controlled oscillator 302. The frequency-to-current converter 320, in turn, is responsive to the non-overlapping clock signals 324 and 326 to facilitate generation of the signal 314 in the feedback conversion circuit 312.

The signal generator 300 includes a feedback conversion circuit 312 with a constant current reference 354 that is in electrical communication with a current charging node 344. A charging circuit 346 in the frequency-to-current converter 320 is also in electrical communication with the current charging node 344. The charging circuit is responsive to the non-overlap clock signals 324 and 326 to alternately charge and discharge a capacitor 348 through a PMOS transistor 350 (which may alternatively be an NMOS-type transistor) and an NMOS transistor 352. To this end, the source of the PMOS transistor 350 is in electrical communication with the current charging node 344. The gate of transistor 350 is in electrical communication with non-overlap clock signal 324 and the drain in electrical communication with the capacitor 348. The drain of the NMOS transistor 352 is in electrical communication with a node that is common to the drain of capacitor 350 and capacitor 348.

Transistors 350 and 352 are switchable between conductive and non-conducted states based on receipt of their respective non-overlapping clock signals from the non-overlap clock circuit 322. In the embodiment of FIG. 3, the PMOS transistor 350 is switchable between a conductive and non-conductive state based on receipt of non-overlapping clock signal 324 and is used to charge the capacitor 348. The NMOS transistor 352 is switchable between a conductive and non-conductive state based on receipt of non-overlapping clock signal 326 and is used to discharge the capacitor 348. Other circuit topologies may also be used to charge and discharge one or more capacitors of the charging circuit 346 in response to one or more non-overlapping clock signals.

The current flow through the branches of the current charging node 344 is dependent on the current flow used to charge and discharge capacitor 348. The difference between the current flow through the charging circuit and the current flow provided by the constant current reference 354 generates a current comparison signal at the current comparison node 344. The magnitude of the difference corresponds to the frequency of the oscillating output signal 304.

In the embodiment of FIG. 3, the current comparison signal provided as the signal 314 is a correction voltage generated by the difference between the reference and charging currents at node 344. The correction voltage is carried in signal 314 in feedback conversion circuit 312. More particularly, the correction voltage is provided to a transconductance amplifier 358 for comparison with the reference voltage $V_{Ref}$ 318. The difference in the magnitude between the correction voltage at output signal 314 and the magnitude of reference voltage $V_{Ref}$ 318 is used to generate a current control signal $I_{Control}$ that is provided as feedback signal 308 to the current controlled oscillator 302.

As in the embodiment of FIG. 2, a feedback loop in FIG. 3 comprising the frequency-to-current conversion circuit 310 and the feedback conversion circuit 312 may not be entirely stable without compensation. Such instability may result in the generation of parasitic oscillation of the feedback signal 308. To inhibit such parasitic oscillation, the feedback conversion circuit 312 may include a loop compensation circuit 360 arranged at the output of the frequency-to-current converter 320. The parameters of the loop compensation circuit 360 are dependent on the overall feedback parameters associated with the frequency-to-current converter 320 and the feedback conversion circuit 312 as well as any other components in the feedback loop. Here, the loop compensation circuit 360 adds a predetermined capacitance to the feedback loop to inhibit parasitic oscillation.

The frequency of the oscillating output signal 304 may be programmable so that the magnitude of the feedback signal 308 is directed to different values to achieve the desired frequency. In the embodiment of FIG. 3, this may be accomplished by programming the magnitude of the current of the constant current source 354. Changes in the magnitude of the current of the constant current source 354 are at least partially responsible for changes in the magnitude of the signal 314 in the feedback conversion circuit 312. In turn, changes in the signal 314 result in corresponding changes to the current feedback signal 308 provided to the oscillator 302. Changes to the feedback signal 308 result in corresponding changes in the frequency of the oscillating output signal 304. Various techniques of programming the magnitude of the current of the constant current source 354 may be used. For example, a processor may write a value to a register, where the value corresponds to the desired frequency. The value stored in the register may be used by the constant current source 354 to set the magnitude of its current value. As described above, the constant current source 354 may be a current DAC.

Figure 4:
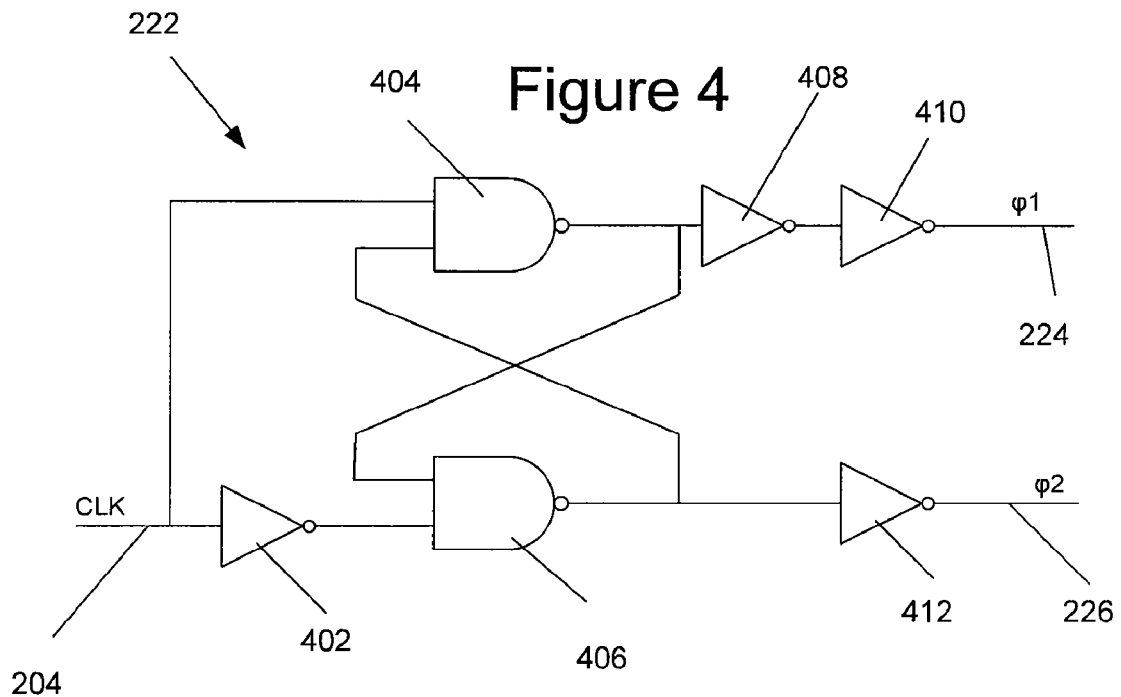
FIG. 4 illustrates one embodiment of a non-overlap clock circuit that may be used in the circuits of FIGS. 2 and 3.

FIG. 4 illustrates one embodiment of a non-overlapping clock circuit 222. As shown the oscillating output signal 204 is concurrently provided to an input of a NOT gate 402 as well as to a first input of a NAND gate 404. The output of NOT gate 402 is provided to a first input of NAND gate 406 and the output of NAND gate 404 is provided to a second input of NAND gate 406. The output of NAND gate 406 is provided to a second input of NAND gate 404. The output of NAND gate 404 is provided to the input of a NOT gate 408, which, in turn, has its output provided to an input of a further NOT gate 410. The output of NOT gate 410 is provided as a non-overlapping clock signal 224. The output of NAND gate 406 is provided to an input of NOT gate 412 which, in turn, provides non-overlap clock signal 226 at its output.

Figure 5:
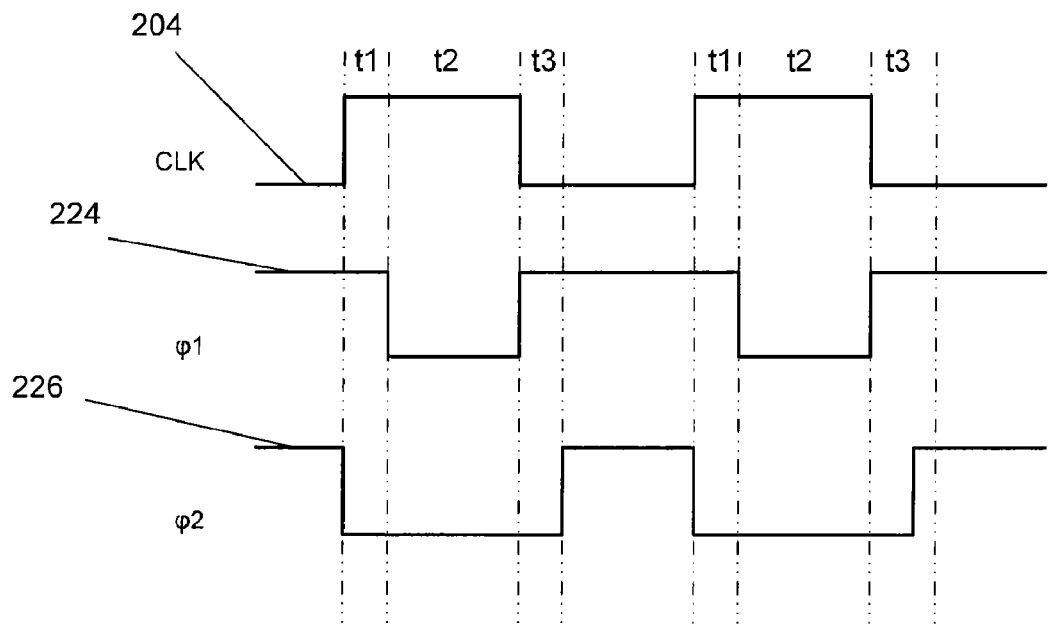
FIG. 5 is a signal diagram showing the operation of the non-overlap clock circuit of FIG. 4.

FIG. 5 is a signal diagram generally showing the correspondence between the oscillating input signal 204, non-overlapping clock signal 224, and non-overlapping clock signal 226. As shown, a rising edge of oscillating output signal 204 from a negative state to a positive state causes the non-overlapping clock signal 226 to fall from a positive state to a negative state. After a time t1 has elapsed, non-overlapping clock signal 224 goes from a positive state to a negative state. During time interval t1, non-overlapping clock signals 224 and 226 are effectively out of phase with one another where signal 224 is at a positive state and signal 226 is at a negative state. During time interval t2, both non-overlapping clock signals 224 and 226 are in a negative state. At the beginning of time interval t3, the oscillating output signal 204 goes to a negative state and triggers non-overlapping clock signal 224 to go to a positive state. Again, during time interval t3, signals 224 and 226 are effectively out of phase with one another where signal 224 is at a positive state while signal 226 remains at a negative state. After time t3 has elapsed, non-overlapping clock signal 226 goes to a positive state. This signal state sequence is executed for each cycle of the oscillating output signal 204. Although illustrated using the oscillating signal 204 and non-overlapping signals 224, 226 of FIG. 2, FIG. 5 also represents the general correspondence between oscillating signal 304 and non-overlapping signals 324, 326 of FIG. 3, and of the general correspondence between the various output signals CLK1 to CLKN and the non-overlapping signals generated by the respective non-overlap clock circuits 622-1 to 622-N of FIG. 6 noted below.

Figure 6:
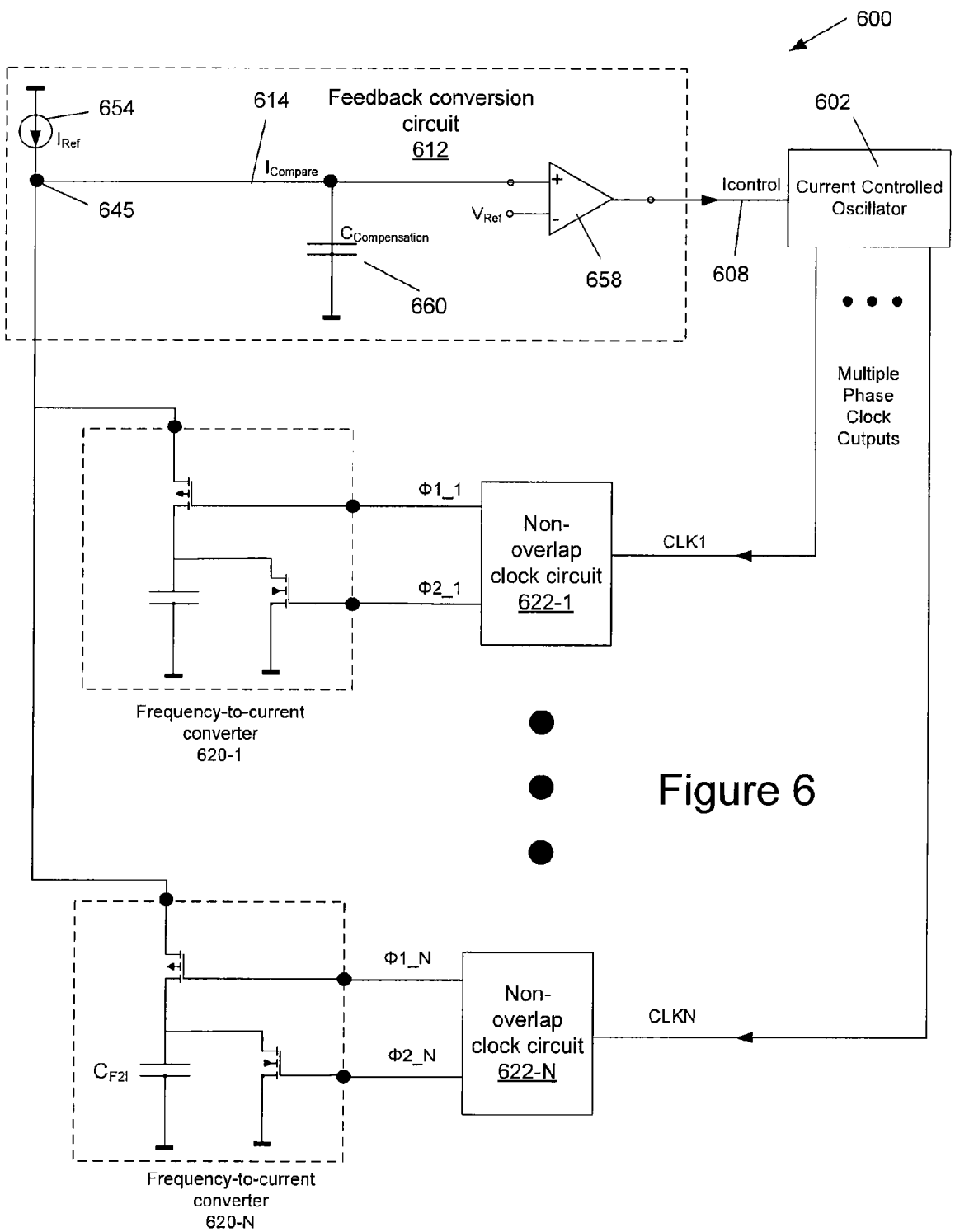
FIG. 6 is a circuit used to implement a signal generator providing multiple phase oscillating output signals, where the signal generator includes a plurality of frequency-to-current converters respectively associated with each of the multiple phase oscillating output signals.

FIG. 6 is an embodiment of a signal generator system 600 used to implement a signal generator providing multiple phase oscillating output signals. In this embodiment, the current controlled oscillator 602 provides a plurality of oscillating output signals CLK1 through CLKN. Each clock signal is provided to a corresponding non-overlap clock circuit 622-1 through 622-N. The non-overlap clock signals from each of the non-overlap clock circuits 622-1 through 622-N are provided as input signals to respective frequency-to-current converters 620-1 through 620-N. The output signals from the frequency-to-current converters 620-1 through 620-N are provided to a common current comparison node 645. The frequency-to-current converters 620-1 through 620-N and non-overlap clock circuit 622-1 through 622-N may each be of the same type as described in the embodiments of FIGS. 2-5. A current reference 654 is likewise provided to the current comparison node 645. A current comparison signal 614 is generated at the current comparison node 645 in feedback conversion circuit 612. The current comparison signal 614 is provided to a first input of a transconductance amplifier 658, which compares the current comparison signal number 614 with a voltage reference at a second input of the transconductance amplifier 658. The output of the transconductance amplifier 658 is in electrical communication with the current controlled oscillator 602 and is provided as the feedback signal 608 used to control the frequencies of the multiple phase clock output signals CLK1 through CLKN.

Figure 7:
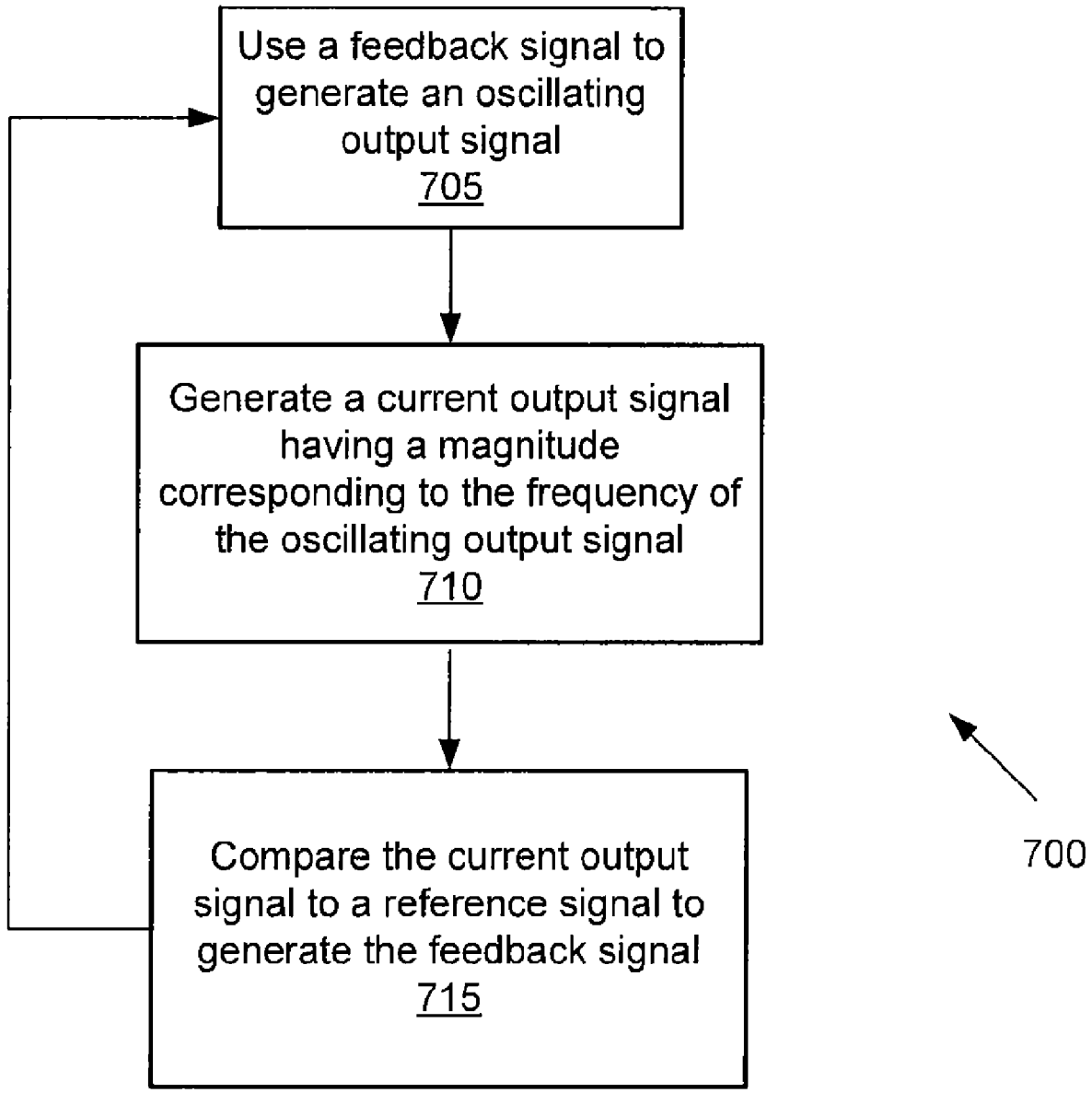
FIG. 7 is a process for generating an oscillating output signal.

FIG. 7 is a process 700 for generating an oscillating output signal that may be executed, for example, using one or more of the foregoing signal generating systems. At 705, a feedback signal is used to generate an oscillating output signal. At 710, a current output signal is generated that has a magnitude that corresponds to the frequency of the oscillating output signal. The current output signal may be generated by providing a first current proportional to the frequency of the oscillating output signal to a current comparison node. At 715, the current output signal is compared to a reference signal to generate the feedback signal. The feedback signal is used to generate the oscillating output signal and the process is resumed at 705.

In the various signal generator embodiments described above, the oscillator may be a current starved ring oscillator circuit, a relaxation oscillator circuit, a voltage controlled oscillator circuit or any of a number of oscillator types capable of being adjustably tuned by a feedback signal. A signal generator and method have been disclosed that includes frequency feedback circuitry to make the oscillation frequency proportional to a temperature stable reference bias current. Because the disclosed frequency feedback circuitry does not require a phase-locked loop (PLL) and a low frequency temperature-stable oscillator, the disclosed oscillator circuit may reduce the area needed to implement the oscillator function in an integrated circuit and reduce power dissipation as compared to oscillator circuits requiring typical PLL circuitry. Reduced power requirements and reduced silicon area needed by an oscillator topology such as disclosed above are may be attractive features for use in integrated circuits of various type including, for example, controller ASICs (application specific integrated circuits) used for flash memory devices.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A signal generator comprising:
    an oscillator circuit responsive to a feedback signal to control a frequency of an oscillating output signal, wherein the oscillator circuit is configured to generate multiple phase oscillating output signals;
    a plurality of frequency-to-current conversion circuits in electrical communication with a respective one of the multiple phase oscillating output signals of the oscillator circuit, wherein each frequency-to-current conversion circuit is configured to generate a frequency dependent current signal, where the frequency dependent current signal corresponds to the frequency of the respective one of the multiple phase oscillating output signals; and
    a feedback conversion circuit in electrical communication with the frequency-to-current conversion circuits, wherein the feedback conversion circuit is configured to compare output signals of the frequency-to-current conversion circuits with a reference signal to generate the feedback signal to the oscillator circuit;
    wherein each frequency-to-current conversion circuit comprises:
        a non-overlap clock circuit disposed to receive the oscillating output signal, wherein the non-overlap clock circuit generates non-overlapping clock signals corresponding to the frequency of the oscillating output signal of the oscillator circuit; and
        a frequency-to-current converter responsive to the non-overlapping clock signals to generate the output signal of the frequency-to-current conversion circuit.

2. The signal generator of claim 1, wherein the output signals of the frequency-to-current conversion circuits are provided to a common current comparison node.

3. The signal generator of claim 1, wherein the frequency-to-current converter comprises a charging circuit, where the charging circuit comprises:
    a capacitor;
    a first MOS transistor switchable between conductive and non-conductive states based on receipt of a first non-overlapping clock signal from the non-overlap clock circuit;
    a second MOS transistor switchable between conductive and non-conductive states based on receipt of a second non-overlapping clock signal from the non-overlap clock circuit; and
    wherein current flow through the first and second MOS transistors alternatively charges and discharges the capacitor to facilitate generation of the output signal of the frequency-to-current conversion circuit.

4. The signal generator of claim 3, wherein the oscillator circuit is a current controlled oscillator and the signal generator further comprises:
    a constant current reference connected to either the first MOS transistor or the second MOS transistor at a current comparison node, wherein the constant current reference is used to charge the capacitor through either the first MOS transistor or the second MOS transistor;
    a voltage-to-current converter having a first input connected to the current charging node, a second input connected to receive a voltage reference signal, and an output signal provided as the feedback signal to the oscillator, wherein the feedback signal corresponds to a difference between the voltage reference signal and a voltage at the current charging node.

5. The signal generator of claim 4, wherein the reference current of the constant current reference circuit is programmable.

6. The signal generator of claim 3, wherein the oscillator circuit is a voltage controlled oscillator and the frequency-to-converter circuit further comprises:
    a current mirror having first and second current branches;
    a constant voltage reference in electrical communication with either the first or second MOS transistors at a voltage charging node, wherein the constant voltage reference is used to charge the capacitor through either the first or second MOS transistor, and wherein a first branch of the current mirror is in electrical communication with the voltage charging node;

a constant current source in electrical communication with the second current branch of the current mirror at a current comparison node, wherein a current at the current comparison node corresponds to a difference between a current of the constant current source and a current flowing through the first branch of the current mirror; and a current-to-voltage converter having a first input in electrical communication with the current comparison node, a second input in electrical communication with a voltage reference signal, and an output signal provided as the feedback signal to the oscillator, wherein the feedback signal corresponds to a difference between the voltage reference signal and a voltage at the current comparison node.

7. The signal generator of claim 6, wherein the reference current of the constant current reference circuit is programmable to vary the frequency of the oscillating output signal.

8. The signal generator of claim 1, further comprising a loop compensation circuit arranged to receive the output signal of the frequency-to-current converter to inhibit parasitic oscillation of the feedback signal.

9. The signal generator of claim 1, wherein the oscillator circuit comprises a current starved ring oscillator.

10. The signal generator of claim 1, wherein the oscillator circuit comprises a relaxation oscillator.

11. The signal generator of claim 1, wherein the oscillator circuit comprises a voltage controlled oscillator.

12. A signal generator comprising:
a current controlled oscillator having an oscillating output signal with a frequency corresponding to a magnitude of a current feedback signal, wherein the current controlled oscillator is configured to generate multiple phase oscillating output signals;
a plurality of frequency-to-current conversion circuits in electrical communication with a respective one of the multiple phase oscillating output signals of the current controlled oscillator, each frequency-to-current conversion circuit comprising:
a non-overlap clock circuit disposed to receive the one of the multiple phase oscillating output signals from the current controlled oscillator, wherein the non-overlap clock circuit generates non-overlapping clock signals corresponding to the frequency of the one of the multiple phase oscillating output signals of the current controlled oscillator; and
a frequency-to-current converter disposed to receive the non-overlapping clock signals, the frequency-to-current converter responsive to the non-overlapping clock signals to generate a frequency dependent current at a current comparison node, wherein the frequency dependent current has a magnitude corresponding to the frequency of the one of the multiple phase oscillating output signals of the current controlled oscillator;

a constant current reference circuit configured to provide a reference current at the current comparison node for comparison with the frequency dependent current to thereby generate a correction voltage at the current comparison node; and a transconductance amplifier having a first input disposed to receive the correction voltage and a second input disposed to receive a reference voltage, the transconductance amplifier having an output in communication with the current controlled oscillator as the current feedback signal.

13. The signal generator of claim 12, wherein the reference current of the constant current reference circuit is programmable to vary the frequency of the oscillating output signal.

14. The signal generator of claim 12, wherein the current controlled oscillator comprises a current starved ring oscillator.

15. The signal generator of claim 12 wherein the current controlled oscillator comprises a relaxation oscillator.

16. The signal generator of claim 12, wherein the frequency-to-current converter comprises:
a capacitor;
a first MOS transistor switchable between conductive and non-conductive states based on receipt of a first non-overlapping clock signal from the non-overlap clock circuit;
a second MOS transistor switchable between conductive and non-conductive states based on receipt of a second non-overlapping clock signal from the non-overlap clock circuit; and
wherein current flow through the first and second MOS transistors alternatively charges and discharges the capacitor to generate the frequency dependent current of the frequency-to-current converter at the current comparison node.

17. The signal generator of claim 12, further comprising a loop compensation circuit in electrical communication with the current comparison node to inhibit parasitic oscillation of the current input signal provided to the current controlled oscillator.

* * * * *